United States Patent
Wu et al.

(10) Patent No.: US 7,994,543 B2
(45) Date of Patent: Aug. 9, 2011

(54) VIA ANTENNA FIX IN DEEP SUB-MICRON CIRCUIT DESIGNS

(75) Inventors: Yi Wu, Santa Clara, CA (US); Kenan Yu, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 671 days.

(21) Appl. No.: 11/828,515

(22) Filed: Jul. 26, 2007

(65) Prior Publication Data

US 2009/0026502 A1  Jan. 29, 2009

(51) Int. Cl.
*H01L 27/10* (2006.01)
*H01L 29/73* (2006.01)
(52) U.S. Cl. .................................. 257/207; 257/208
(58) Field of Classification Search .............. 257/202, 257/204, 207–209, 211, E27.07, E27.073, 257/E27.081
See application file for complete search history.

(56) References Cited

U.S. PATENT DOCUMENTS

| 5,393,701 A | 2/1995 | Ko et al. |
| 5,500,542 A * | 3/1996 | Iida et al. ..................... 257/210 |

* cited by examiner

*Primary Examiner* — Hung Vu
(74) *Attorney, Agent, or Firm* — Polsinelli Shughart PC

(57) ABSTRACT

A filler cell for use in fabricating an integrated circuit. The filler cell couples a power supply rail of an adjacent logic cell to a power supply rail of another adjacent logic cell. The filler cell also has a diode to bleed charge accumulated on the power rails of the adjacent logic cells to the substrate. The diode is reverse biased during normal integrated circuit operation. A method for fabricating an integrated circuit with a power grid. At least one filler cell is placed on the integrated circuit to bleed away charge accumulated on the power grid during the fabrication of the integrated circuit. The filler cell is connected to a supply rail of an adjacent logic cell.

8 Claims, 5 Drawing Sheets

(BACKGROUND)

(BACKGROUND)

VIA ANTENNA FIX IN DEEP SUB-MICRON CIRCUIT DESIGNS

FIELD OF THE INVENTION

Aspects of the present invention relate to the design and manufacture of integrated circuits. One particular aspect of the present invention relates to via antenna protection to eliminate electrostatic charge buildup on a device during the fabrication process.

BACKGROUND

When an integrated circuit is fabricated, interconnects may build up a charge during various process steps. Interconnects generally refer to the wires used to link transistors together and may be fabricated from metal or polysilicon. When an interconnect with a large surface area is connected to the gate of a MOS transistor, the charge accumulated on the interconnect may result in a sufficiently high voltage potential on the gate to rupture the gate oxide. As fabrication process advances continue to shrink feature sizes, the gate oxide thickness of devices also continues to decrease. Thus, MOS transistors fabricated with thinner gate oxide layers become more susceptible to damage caused by charge build-up on a via connected to the gate of the device.

To reduce the likelihood of process induced gate oxide damage due to charge build-up, generally referred to as the "antenna effect," a design rule checker may be run to flag antenna effects likely to cause gate oxide breakdown. An "antenna" may be any interconnect, i.e., a conductor such as polysilicon or metal, that is in electrical contact with a gate. These exposed polysilicon or metal structures connected to the gate generally collect charge from the processing environment, e.g., reactive ion etch. This charge can be concentrated in the gate oxide resulting in a voltage potential sufficiently large to rupture the gate oxide if an alternative electrical path does not exist to bleed-off the accumulated charge.

During the design process, design verification and layout software generally referred to as design rule checker (DRC) programs are generally used to predict antenna ratios and flag ratios likely to cause the antenna effect. The "antenna ratio" of an interconnect is generally defined as the ratio between the physical area of the conductors making up the antenna to the total gate oxide area to which the antenna is connected. A higher ratio implies a greater propensity for gate oxide failure due to the antenna effect. A higher ratio may be the result of a relatively larger area to collect charge or a reduced gate oxide area on which the charge is concentrated.

FIG. 1 depicts a portion of an integrated circuit 100 fabricated on a p-type substrate 102. The integrated circuit 100 has multiple metal layers M1, M2, M3, M4 and n-type diffusions 104A-104F. A transistor gate 110 is connected to metal layer M3 through vias 106. Metal layer M3 then is connected to a diffusion region 104C through vias 108 and metal layer M4. In this particular situation, the area (length times width) of the metal line may not be large enough to accumulate sufficient charge during fabrication. Therefore, during the design phase, a DRC program would not flag this situation.

Now consider another transistor with a gate 116. The gate 116 is connected to metal layer M3 through vias 112. Again, metal layer M3 eventually connects to a diffusion region 104F through vias 114 and metal layer M4. However, in this case, the area of this interconnect may be large enough due to its increased length to accumulate enough charge to rupture the oxide of gate 116. That is, during processing, a gate oxide may be ruptured by accumulated charge if the gate sees a long metal interconnect before a diffusion region does. In such situations, a DRC program would flag such interconnect regions as antenna rule violations. Generally an interconnect in close enough proximity with a diffusion region is considered safe because the diffusion region will allow the charge accumulated on the interconnect to leak away harmlessly.

One conventional solution to the antenna problem involves adding a diode near a susceptible transistor as depicted in FIG. 2. Diode 200 is connected to gate 202 via metal layer M1. Diode 200 may be fabricated by placing a n diffusion 206 in a p substrate 208 to form a pn junction diode. During normal chip operation, this diode 200 is reverse biased, i.e., turned off and not conducting any current. However, during processing, the diode 200 allows charge to leak away harmlessly should the voltage potential on the gate become greater than the forward voltage, $V_f$, of the diode 200. When the gate voltage reaches $V_f$, the diode 200 becomes conducting, allowing current to flow from the gate to the substrate, i.e., the diode 200 bleeds the charge off through the substrate. Thus, if the gate is designed to withstand a voltage potential of about 1 volt, a diode with a forward voltage drop of about 0.7 volt will bleed-off charge before the gate potential reaches 1 volt, providing protection for the transistor device.

However, this approach generally requires the addition of diodes to a chip layout when antenna violations are discovered during the design process. For deep sub-micron integrated circuit designs, antenna violations may occur more often because of thinner gate oxides. Additionally, the fixes may involve moving existing components to make room for the protection diode. The addition of additional components or movement of existing components results in an additional verification step to verify that there are no new timing violations or other layout rule violations introduced by the changes. Because the antenna rule check is generally done toward the end of a design cycle, antenna fixes that require a substantial amount of change to the integrated circuit may adversely impact the design schedule. These additional steps can complicate the design process and may extend the overall design process.

A second conventional approach to the antenna problem tries to reduce the amount of metal connected to the gate of the transistor to bring the antenna ratio below the antenna design rule threshold. This might be done by reducing the size of the interconnect by relocating components such that they are closer together. A smaller interconnect has less metal to accumulate charge during fabrication and is thus less likely to result in a gate voltage potential high enough to blow the gate oxide. Alternatively, the polysilicon and metal interconnections can be isolated from the gate oxide during plasma etching as described in U.S. Pat. No. 5,393,701 issued to Ko et al., dated Feb. 28, 1995.

This second approach may not be feasible in certain situations. For example, many devices in modern integrated circuits have their gates tied to a power grid (Vdd or Vss). The power grid is the power supply network that distributes power to the various components of the integrated circuit. A power plane is generally considered an ideal power distribution network but requires a large amount of metal resources to implement. Thus, a dense power grid may be used in place of a power plane. The entire power grid (Vdd or Vss) generally functions as a giant antenna (metal and vias) during the fabrication process. The power grid typically cannot be changed.

The traditional solutions to on-chip antenna problems described above are generally time consuming and may introduce new design rule errors during the design process. What is needed is a solution to the antenna problem that does not require additional design steps or changes to the existing chip layout. What is further needed is a solution that works for transistors having their gates tied to the power grid.

SUMMARY

One aspect of the present invention involves a filler cell for use in fabricating an integrated circuit. The filler cell has a first cell with an interconnect that connects the power supply rails of logic cells adjacent to the filler cell and a diode cell having a diode connected to the power supply rail and the substrate of the integrated circuit. The diode is reverse biased during normal integrated circuit operation and bleeds charge accumulated on the power supply rail during fabrication of the integrated circuit to the substrate.

Another aspect of the present invention involves a method for fabricating an integrated circuit having a power grid. The method includes placing a plurality of logic cells on the integrated circuit and placing at least one filler cell on the integrated circuit to bleed away charge accumulated on the power grid to the substrate during the fabrication of the integrated circuit. The filler cell is connected to a supply rail of an adjacent logic cell.

DETAILED DESCRIPTION OF EMBODIMENTS OF THE INVENTION

Aspects of the present invention involve a new filler cell that includes a diode cell. The new filler cell can be inserted between adjacent gate cells to provide a more uniform power grid and to provide a plurality of channels for bleeding charge accumulated on the power grid to the substrate. The new filler cells can be inserted during the initial design phase of an integrated circuit, without requiring subsequent design changes. Bleeding any accumulated charge to the substrate reduces the likelihood of process induced gate oxide damage to transistors having their gates tied to the power grid.

In one embodiment of the present invention, a diode cell may be created using a n-type diffusion in a p-type substrate of an integrated circuit to form a pn junction diode. The n-type diffusion is connected to the Vdd metal of the filler cell. Some embodiments of the present invention may use various sized filler cells. The various sized filler cells may utilize diode cells that are of uniform size or may utilize non-uniform size diode cells having larger or smaller pn junction diodes.

During the fabrication of an integrated circuit, devices with thin gate oxides may accumulate sufficient charge from the processing environment to develop voltage potentials sufficiently large to rupture (or blow) the oxide, i.e., cause a current to flow through the gate oxide that creates a short in the gate oxide layer from the gate to the channel of the transistor. Should this occur, these devices may be damaged such that they do not function properly or will prematurely fail. Moreover, charge based failures can cause yield loss and reliability problems. As fabrication processes continue to shrink, e.g., go from 130 nm feature sizes to 65 nm feature sizes, gate oxide thickness also continues to decrease, making the smaller devices more susceptible to electrostatic charge buildup damage. Additionally, the small devices may be more susceptible to electrical charges collected by vias which creates another antenna problem to be dealt with during the design process.

Figure 1:
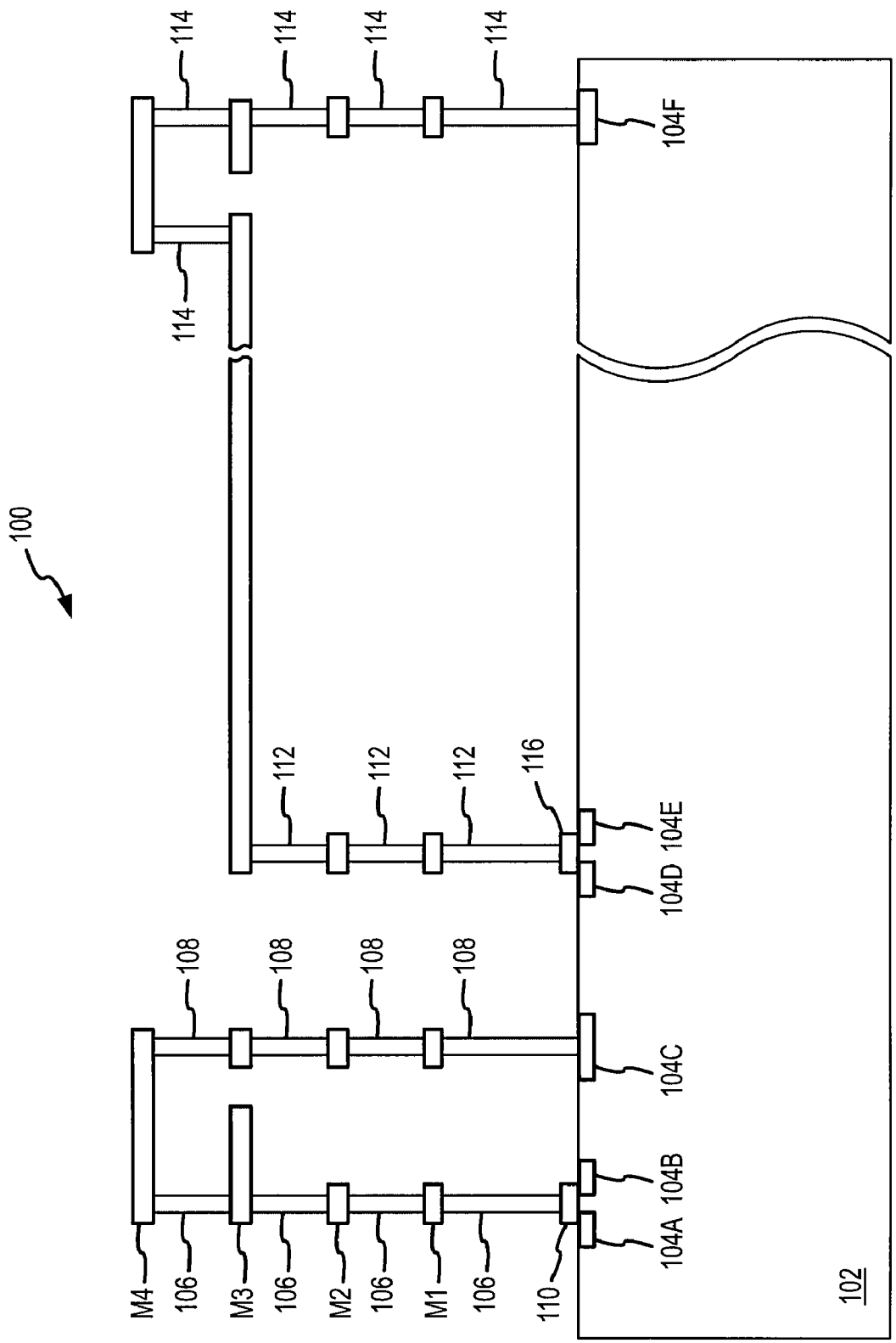
FIG. 1 depicts an integrated circuit having multiple metal layers, diffusion regions and transistor gates.
Figure 2:
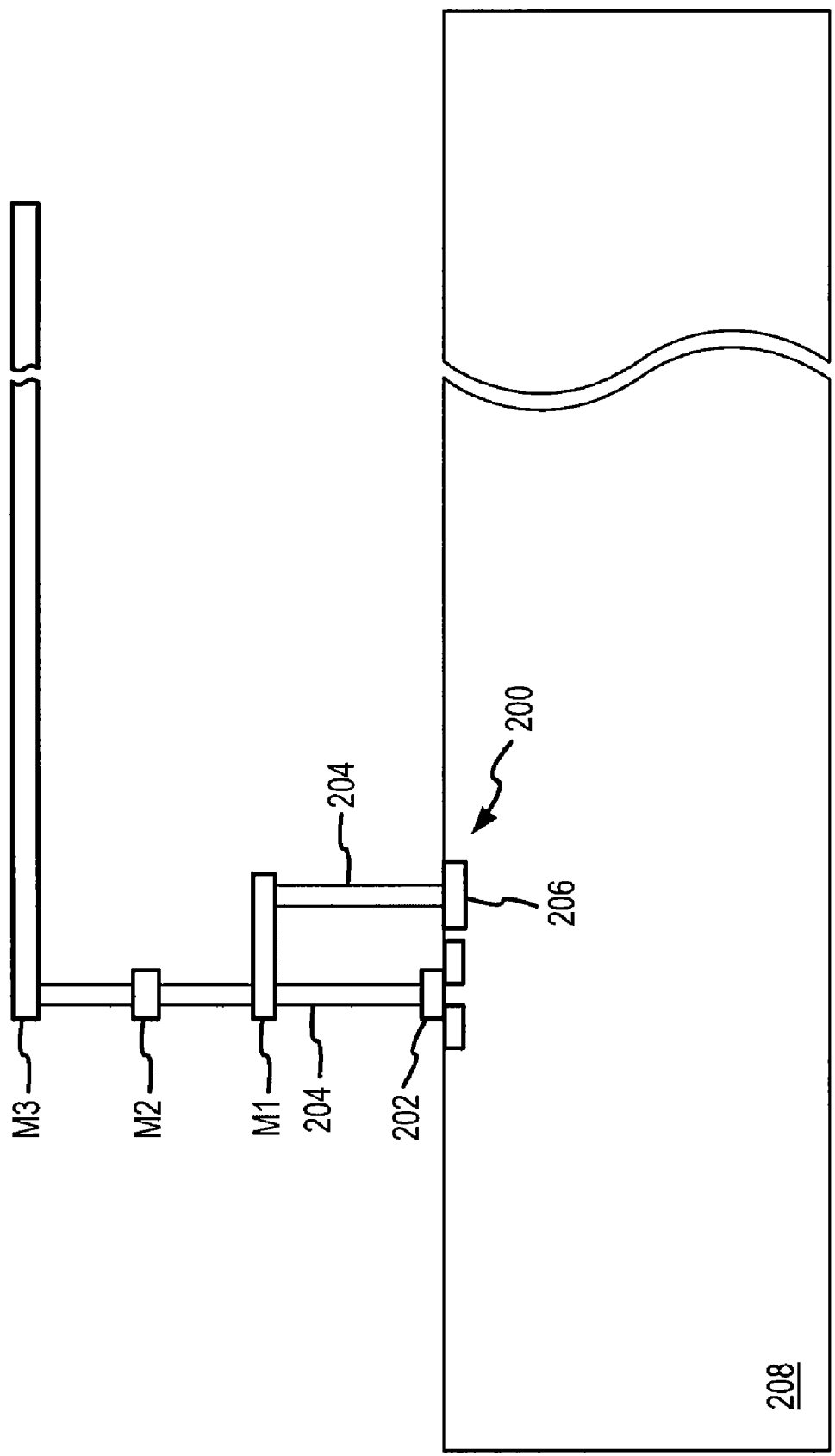
FIG. 2 depicts a transistor gate protected from induced gate oxide damage using a diode.
Figure 3:
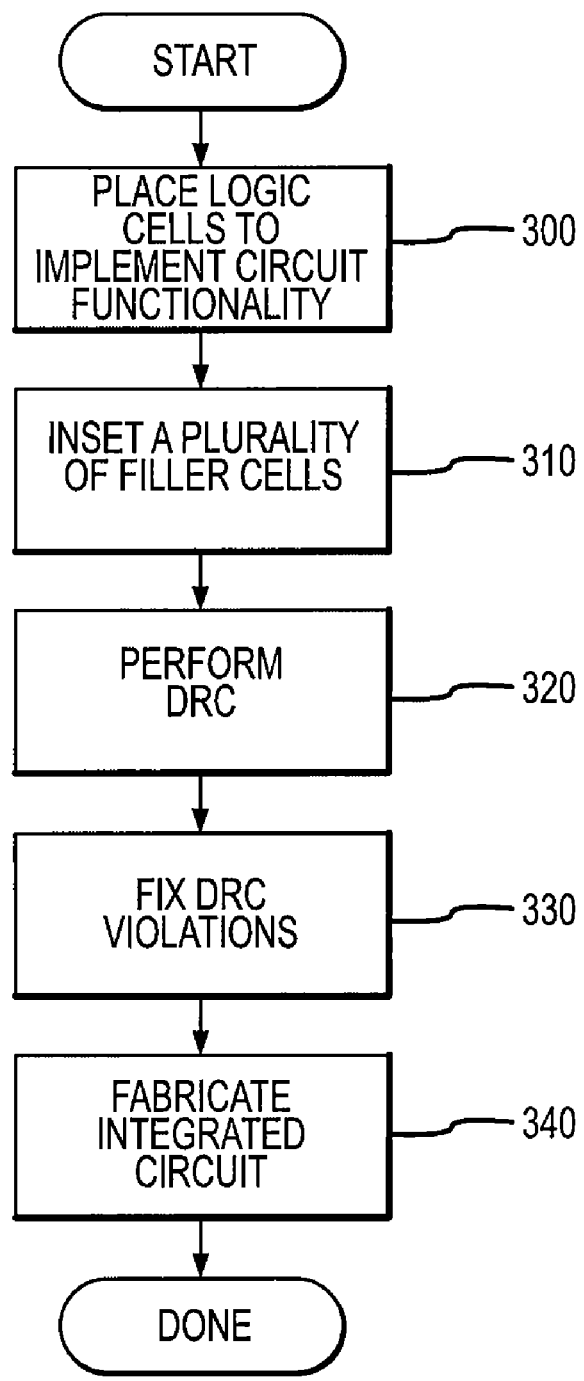
FIG. 3 depicts a flowchart of a design process of an integrated circuit that utilizes a new filler cell of one embodiment of the present invention.

FIG. 3 depicts a flowchart of a design process of an integrated circuit that utilizes the new filler cells. Initially, during operation 300, a chip designer places various types of gate cells to implement the desired integrated circuit functionality. During this process, the gate cells are generally spaced relative to one another to meet timing constraints. Such gate placements may result in space between the gates. Next, during operation 310, filler cells may be automatically placed between the gate cells. This is generally done to provide a more uniform power grid. Gaps in the power grid force current to flow around the gap and may have the undesirable effect of increasing path loop area and inductance. Generally low inductance power grids are desired to reduce power consumption during circuit switching.

Rather than using a standard filler cell that only interconnects the power grid during operation 310, the new filler cell may be utilized. In some embodiments of the present invention, the new filler cell may be utilized whenever there is space for it. In other embodiments, the new filler cell may be substituted for some number of standard filler cells.

After operation 310, operation 320 performs a design rule check to verify that the design meets the various design rules of the target fabrication process. Any rule violations are flagged. Notably, this is a typical fabrication design check and is not inspired by the insertion of the new filler cell design. Moreover, because the new filler cell is already inserted in the design, subsequent design rule verification and possible changes are not driven by the insertion of antenna fixes later in the design process. Then in operation 330, any design rule violations are fixed. This may involve insertion of additional gates and components as well as relocation of existing gates and components. If components are added or moved, then operation 320 is performed again to verify that the changes did not introduce any new design rule violations. When the design passes the design rule checks, operation 340 is performed to fabricate the integrated circuit.

Figure 4:
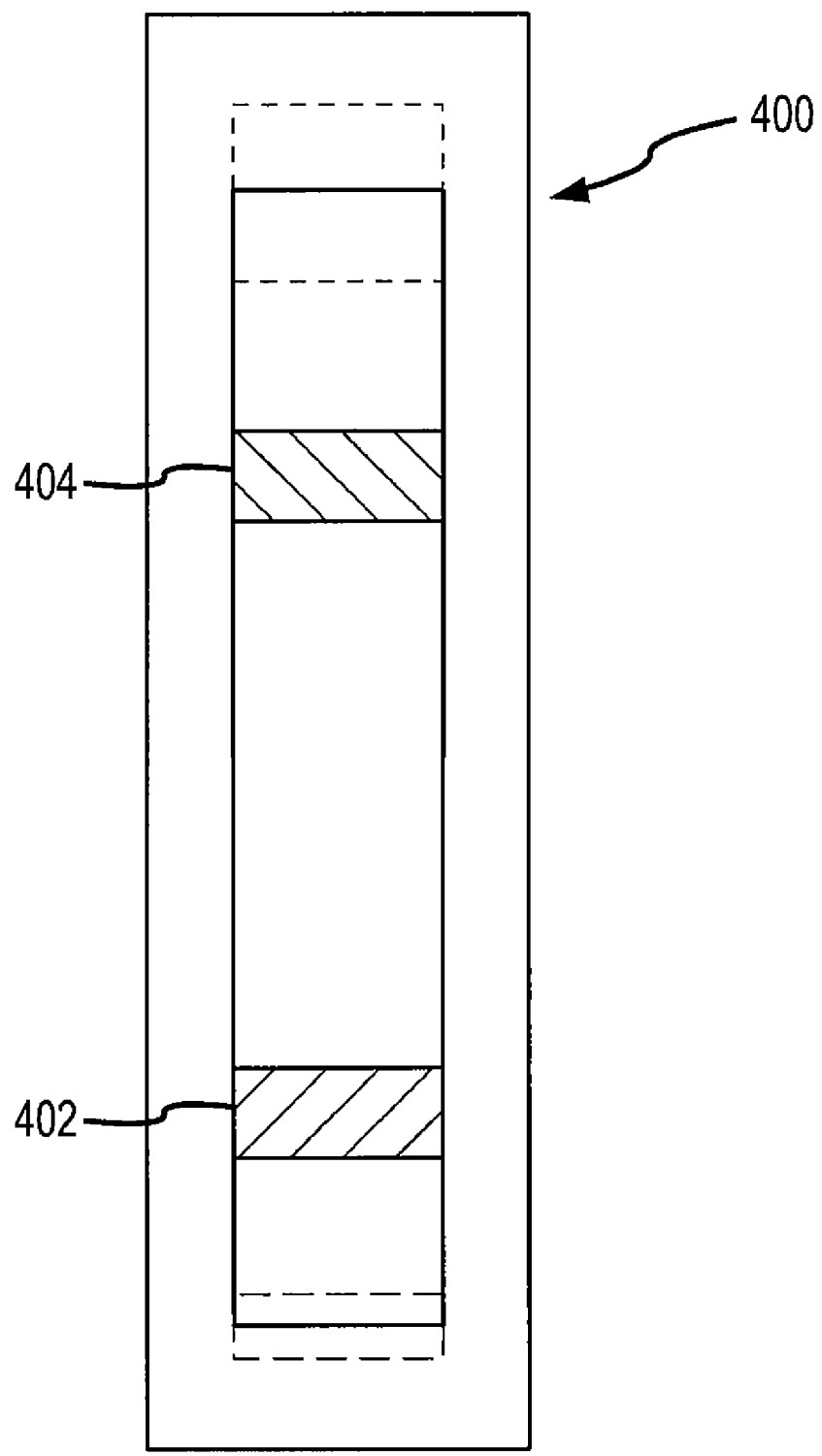
FIG. 4 depicts a standard filler cell that does not have a diode cell.

A typical integrated chip may contain tens to hundreds of thousands of standard filler cells 400, which are depicted in FIG. 4. These standard filler cells may come in various sizes, e.g., small, medium, large and extra large. These filler cells, among other things, help make the power grid continuous by interconnecting the power rails of adjacent gates to eliminate gaps in the power rails. That is, the standard filler cell 400 typically has a piece of metal 402 that interconnects the Vss rail of an adjacent gate cell to the Vss rail of another adjacent cell. It also has a piece of metal 404 that interconnects the Vdd rail of adjacent gate cell to the Vdd rail of the other adjacent gate cell. This results in a continuity in the Vdd and Vss rails.

Figure 5:
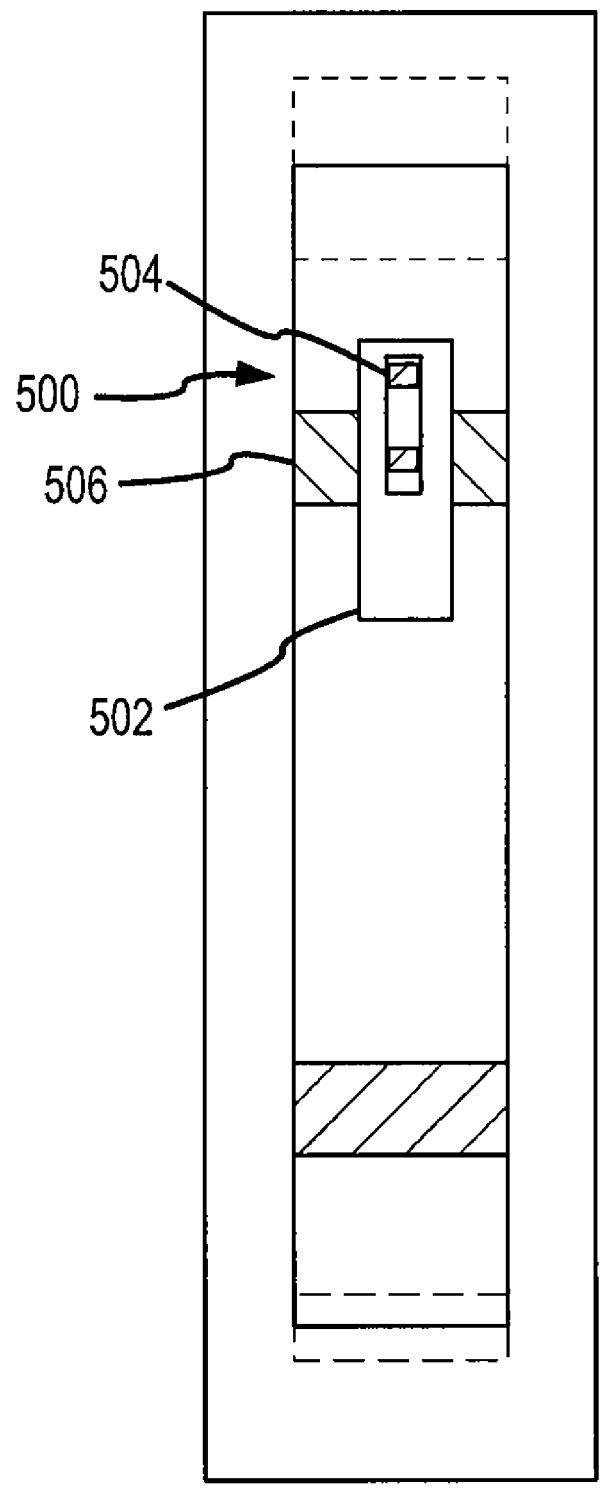
FIG. 5 depicts an embodiment of a new filler cell that includes a diode.

These filler cells enable the new approach set forth herein to solving the antenna problem for devices with tied gates (gates tied to the power grid). Namely, a diode cell 502 may be placed within the filler cell to create a new version of the filler cell 500, as depicted in FIG. 5. This new filler cell 500 may be designed and laid out early in the design process, long before an antenna rule check is run on the integrated circuit design. Because there is generally ample space available in a filler cell, the diode can be added without introducing any new DRC errors.

The diode 504 within the filler cell 500 may connect the Vdd rail 506 to the substrate 508. During normal circuit operation the diode 504 is reverse biased. However, during chip fabrication, the diode 504 can provide a channel to drain away excess charge accumulated on the power grid to the substrate. By replacing some number of the standard filler cells 400 with the new version of filler cell 500, many channels can be provided to bleed excess charge to the substrate, thereby providing protection for tied-gate transistors located almost anywhere on the chip. This design modification may be incorporated at the beginning of the design process and therefore will not introduce any additional design steps. The new filler cell 500 helps avoid layout changes to fix via antenna problems, eliminating the possibility of new DRC errors from via antenna fixes and the need to re-verify circuit timing.

The normal design process may be used to insert the new filler cells 500 which serve to not only as normal filler cells but also as diode cells for via antenna protection. This avoids additional design steps and may reduce overall chip design time by avoiding design complications that may arise when components are added or existing components are moved (DRC timing, placement, routing errors).

As will be recognized by those skilled in the art from the foregoing description of example embodiments of the invention, numerous variations of the described embodiments may be made without departing from the spirit and scope of the invention. For example, a n-channel transistor with the gate tied to the source may be used instead of a n-diffusion in a p-type substrate to form the diode protection cell. Further, while the present invention has been described in the context of specific embodiments and processes, such descriptions are by way of example and not limitation. Accordingly, the proper scope of the present invention is specified by the following claims and not by the preceding examples.

What is claimed is:

1. A filler cell for use in fabricating an integrated circuit having a substrate, the filler cell comprising:
   a first cell comprising:
      an interconnect to directly connect a $V_{ss}$ power supply rail of a first adjacent logic cell of the integrated circuit to a corresponding $V_{ss}$ power supply rail of a second adjacent logic cell of the integrated circuit; and
      a diode cell comprising a diode operably coupled between a $V_{dd}$ power supply rail of the first adjacent logic cell and the substrate such that the diode is reverse biased during normal integrated circuit operation; and
   wherein the diode cell bleeds charge accumulated on the $V_{dd}$ power rail during fabrication of the integrated circuit to the substrate.

2. The filler cell of claim 1 wherein the diode is a pn junction.

3. The filler cell of claim 1 wherein the interconnect is fabricated from a material chosen from the group consisting of copper, gold, aluminum, tungsten, titanium, silver, and polysilicon.

4. The filler cell of claim 1 wherein the diode cell is located within the first cell.

5. An integrated circuit having a substrate and a power grid, comprising:
   a plurality of logic cells;
   at least one filler cell operable to bleed away charge accumulated on the power grid during fabrication to the substrate, the at least one filler cell comprising:
      an interconnect to direct connect a $V_{ss}$ power supply rail of an adjacent logic cell to a corresponding $V_{ss}$ power supply rail of another adjacent logic cell; and
      a diode operably coupled between a $V_{dd}$ power supply rail of the adjacent logic cell and the substrate to bleed away the charge.

6. The integrated circuit of claim 5 wherein the filler cell further comprises:
   a diode cell comprising the diode operably coupled to the $V_{dd}$ power supply rail and the substrate such that the diode is reverse biased during normal integrated circuit operation; and
   wherein the diode cell bleeds charge accumulated on the $V_{dd}$ power supply rail during fabrication of the integrated circuit to the substrate.

7. The integrated circuit of claim 6 wherein the diode cell is a pn junction.

8. The integrated circuit of claim 5 further comprising: at least
   one transistor having its gate connected to the power grid; and wherein the
   filler cell is configured to protect the transistor from damage due to a charge build-up on the power grid during integrated circuit fabrication.

* * * * *